US012610457B2

(12) United States Patent
Sano et al.

(10) Patent No.: US 12,610,457 B2
(45) Date of Patent: Apr. 21, 2026

(54) STRETCHABLE DEVICE

(71) Applicant: Magnolia White Corporation, Tokyo (JP)

(72) Inventors: Takumi Sano, Tokyo (JP); Masatomo Hishinuma, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 207 days.

(21) Appl. No.: 18/472,241

(22) Filed: Sep. 22, 2023

(65) Prior Publication Data

US 2024/0121892 A1     Apr. 11, 2024

(30) Foreign Application Priority Data

Oct. 5, 2022     (JP) ................................. 2022-160767

(51) Int. Cl.
*H05K 1/02* (2006.01)
(52) U.S. Cl.
CPC . *H05K 1/0283* (2013.01); *H05K 2201/10151* (2013.01)
(58) Field of Classification Search
CPC ................... H05K 1/0283; H05K 2201/10151
See application file for complete search history.

(56) References Cited

U.S. PATENT DOCUMENTS 11,621,399 B2     4/2023   Sano

FOREIGN PATENT DOCUMENTS

JP          2021-118273  A      8/2021
WO     WO-2017003531 A1 *   1/2017   ........... H05K 1/0274

* cited by examiner

*Primary Examiner* — Jeremy C Norris
(74) *Attorney, Agent, or Firm* — XSENSUS LLP

(57)          ABSTRACT

A stretchable device includes a resin base member, a signal line, and a strain gauge. The resin base member includes: bodies disposed separately from each other; and hinges that couple the bodies while meandering. Each hinge includes: a base and bends. The bends include a first bend coupled to the base. The first bend includes a first inner peripheral portion and a first outer peripheral portion with respect to a center in a width direction orthogonal to a length direction in which the hinge extends. The base includes an inner peripheral coupling portion coupled to the first inner peripheral portion and an outer peripheral coupling portion coupled to the first outer peripheral portion with respect to the center in the width direction. The signal line is provided to the hinge. An imaginary center line passing through the center of the signal line overlaps the outer peripheral coupling portion.

5 Claims, 16 Drawing Sheets

FIG.2

STRETCHABLE DEVICE

CROSS-REFERENCE TO RELATED APPLICATION

This application claims the benefit of priority from Japanese Patent Application No. 2022-160767 filed on Oct. 5, 2022, the entire contents of which are incorporated herein by reference.

BACKGROUND

1. Technical Field

What is disclosed herein relates to a stretchable device.

2. Description of the Related Art

Stretchable devices have excellent elasticity and flexibility. Such stretchable devices include a resin base member on which an array layer is stacked. The resin base member includes bodies arrayed in a matrix (row-column configuration) and hinges that couple the bodies to each other. The hinge described in Japanese Patent Application Laid-open Publication No. 2021-118273 includes a plurality of arcs and has a meandering shape. When a tensile load acts on the stretchable device, the arcs of the hinge deform to have a smaller curvature. In other words, the arcs deform to expand. As a result, the bodies are separated from each other, and the stretchable device extends.

In recent years, it has been considered to provide a strain gauge to the hinge and detect the amount of strain in the hinge to detect the load acting on the stretchable device. If strain is generated in a signal line stacked on the hinge, noise components are contained in signals. In addition, if strain is generated in a part of the strain gauge other than the part for detecting the amount of strain in the hinge, noise components are contained in signals. As a result, the amount of strain in the hinge may not be accurately detected.

For the foregoing reasons, there is a need for a stretchable device that can accurately detect the amount of strain in a hinge.

SUMMARY

According to an aspect, a stretchable device includes: a resin base member; and a signal line and a strain gauge stacked on the resin base member. The resin base member includes: a plurality of bodies disposed separately from each other; and a plurality of hinges that couple the bodies while meandering. The hinges each includes: a base linearly extending from the body; and a plurality of bends. The bends include a first bend coupled to the base. The first bend includes a first inner peripheral portion positioned on an inner peripheral side and a first outer peripheral portion positioned on an outer peripheral side with respect to a center in a width direction serving as a boundary, the width direction being orthogonal to a length direction in which the hinge extends. The base includes an inner peripheral coupling portion coupled to the first inner peripheral portion and an outer peripheral coupling portion coupled to the first outer peripheral portion with respect to the center in the width direction serving as a boundary. The signal line is provided to the hinge. An imaginary center line passing through the center of the signal line in the width direction overlaps the outer peripheral coupling portion when viewed in a stacking direction in which the signal line is stacked on the resin base member.

According to an aspect, a stretchable device includes: a resin base member; and a signal line and a strain gauge stacked on the resin base member. The resin base member includes: a plurality of bodies disposed separately from each other; and a plurality of hinges that couple the bodies while meandering. The hinges each include: a base linearly extending from the body; and a plurality of bends. The bends include: a first bend coupled to the base; and a second bend coupled to the first bend. The first bend includes a first inner peripheral portion positioned on an inner peripheral side and a first outer peripheral portion positioned on an outer peripheral side with respect to a center in a width direction serving as a boundary, the width direction being orthogonal to a length direction in which the hinge extends. The second bend includes a second inner peripheral portion positioned on the inner peripheral side and a second outer peripheral portion positioned on the outer peripheral side with respect to the center in the width direction serving as a boundary. The second inner peripheral portion is coupled to the first outer peripheral portion. The second outer peripheral portion is coupled to the first inner peripheral portion. The strain gauge is provided to the hinge. The strain gauge includes: strain detectors overlapping the first inner peripheral portion and the second inner peripheral portion or the first outer peripheral portion and the second outer peripheral portion when viewed in a stacking direction in which the signal line is stacked on the resin base member; and an intersection that extends in the width direction at a boundary between the first bend and the second bend and couples the strain detectors. A corner between the strain detector and the intersection has a tapered shape.

BRIEF DESCRIPTION OF THE DRAWINGS

FIG. 2 is a schematic of a section of the stretchable device according to the first embodiment, and more specifically a sectional view along line II-II of FIG. 3;

DETAILED DESCRIPTION

Figure 1:
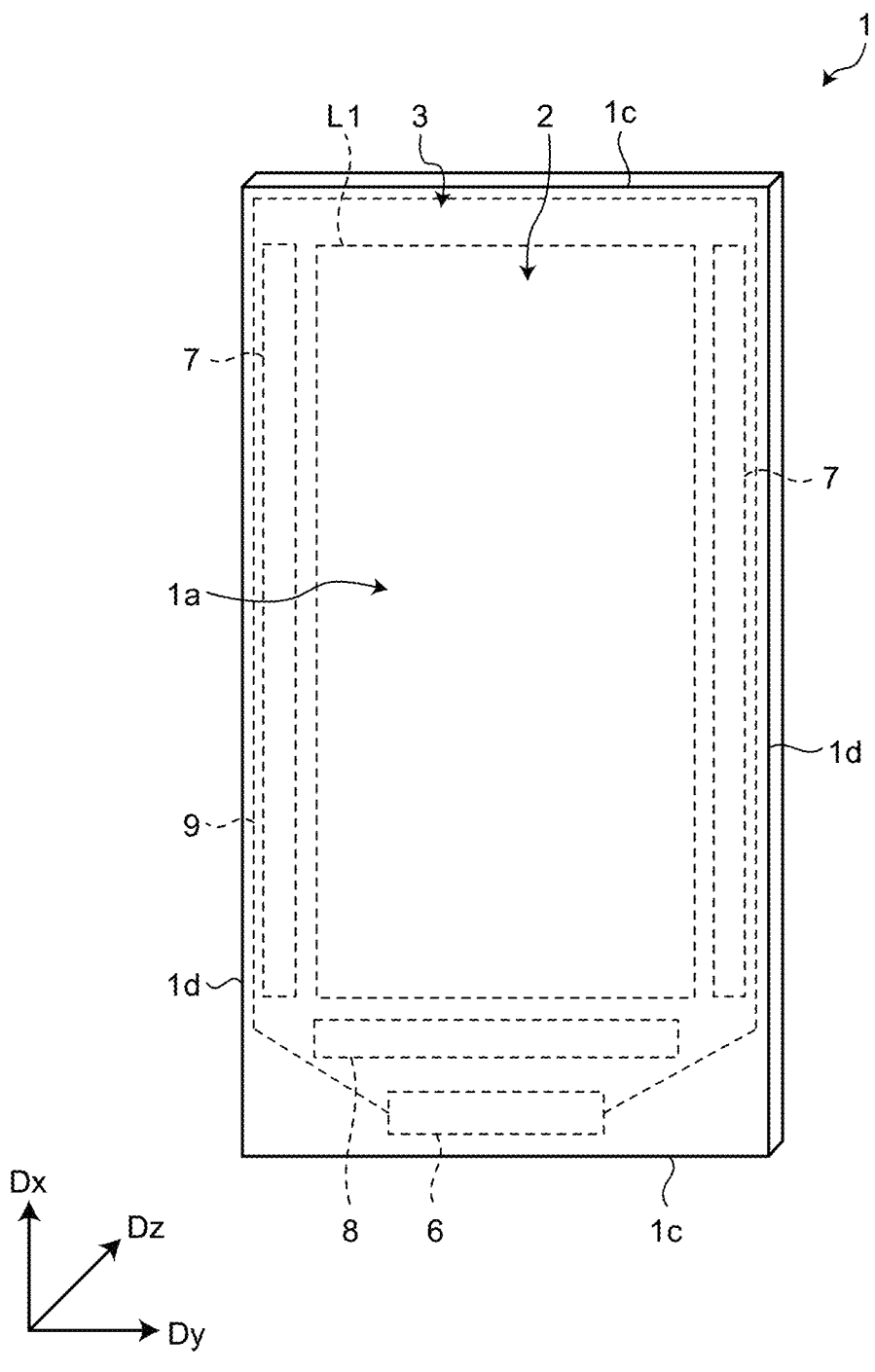
FIG. 1 is a schematic perspective view of a stretchable device according to a first embodiment.

Exemplary aspects (embodiments) to embody the present disclosure are described below in greater detail with reference to the accompanying drawings. The contents described in the embodiments below are not intended to limit the invention according to the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the drawings, components similar to those previously described with reference to previous drawings are denoted by the same reference numerals, and detailed explanation thereof may be appropriately omitted.

When the term "on" is used to describe an aspect where a first structure is disposed on or above a second structure in the present specification and the claims, it includes both of the following cases unless otherwise noted: a case where the first structure is disposed on and in contact with the second structure, and a case where the first structure is disposed above the second structure with still another structure interposed therebetween.

First Embodiment

FIG. 1 is a schematic perspective view of a stretchable device according to a first embodiment. As illustrated in FIG. 1, this stretchable device 1 has a flat plate shape. The stretchable device 1 has a surface 1a and a back surface 1b (not illustrated in FIG. 1, so refer to FIG. 2) facing opposite directions. In the following description, the direction parallel to the surface 1a and the back surface 1b is referred to as a planar direction. A direction parallel to the planar direction is referred to as a first direction Dx. A direction parallel to the planar direction and intersecting the first direction Dx is referred to as a second direction Dy.

The surface 1a and the back surface 1b have a rectangular (quadrilateral) shape. The surface 1a has a pair of short sides 1c and a pair of long sides 1d. The first direction Dx according to the present embodiment is a direction parallel to the long side 1d. The second direction Dy is a direction parallel to the short side 1c. In other words, the first direction Dx and the second direction Dy according to the present embodiment are orthogonal to each other. The normal direction (stacking direction) of the surface 1a is referred to as a third direction Dz. The view of the stretchable device 1 in the third direction Dz may be referred to as plan view.

The stretchable device 1 is divided into a detection region 2 and a peripheral region 3 in plan view. The detection region 2 is a region in which the amount of strain of the stretchable device 1 can be detected. The peripheral region 3 is a frame-like region surrounding the outer periphery of the detection region 2. In FIG. 1, a boundary line L1 is drawn to make the boundary between the detection region 2 and the peripheral region 3 easy to understand.

Figure 2:
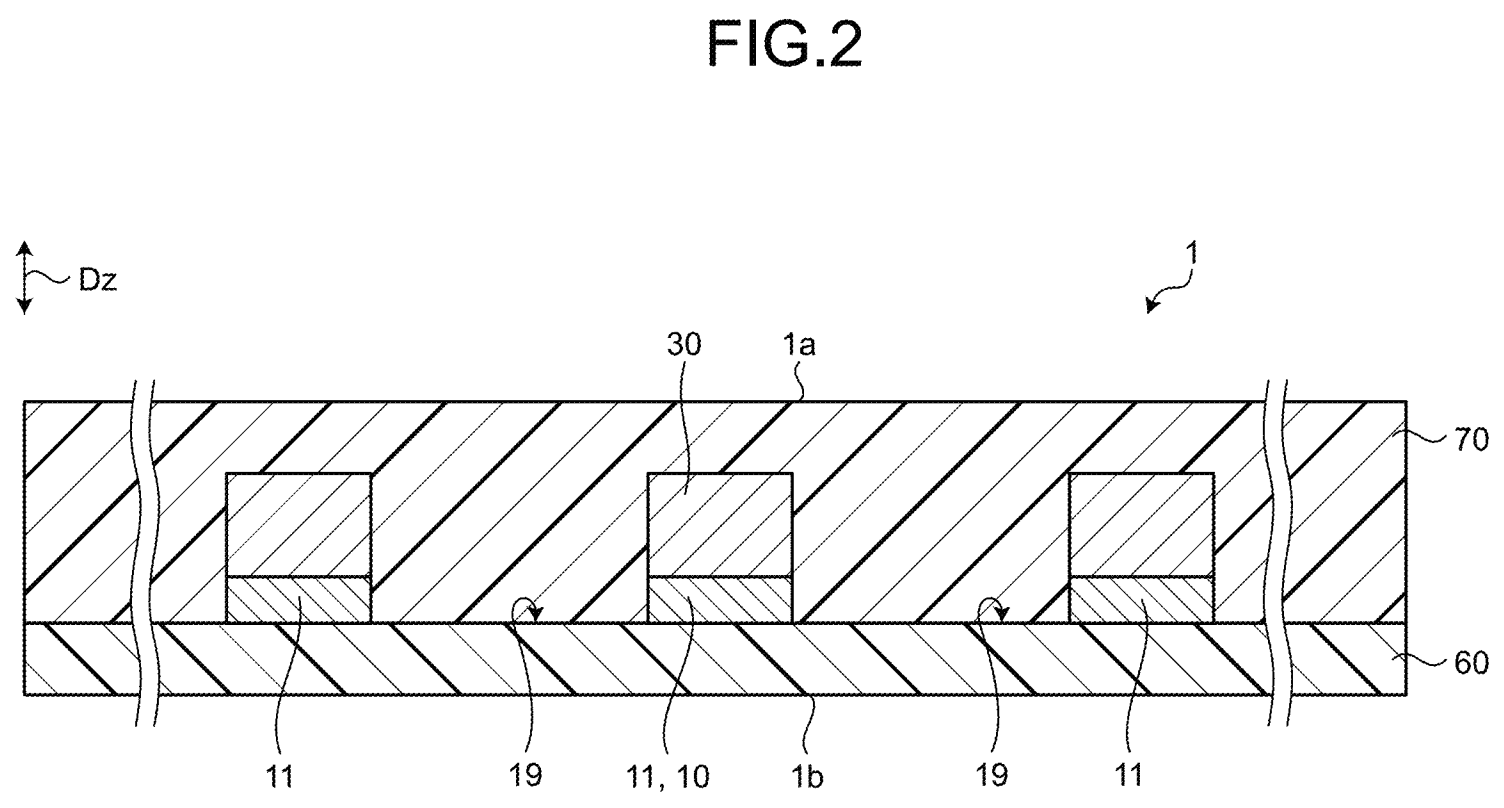
Figure 3:
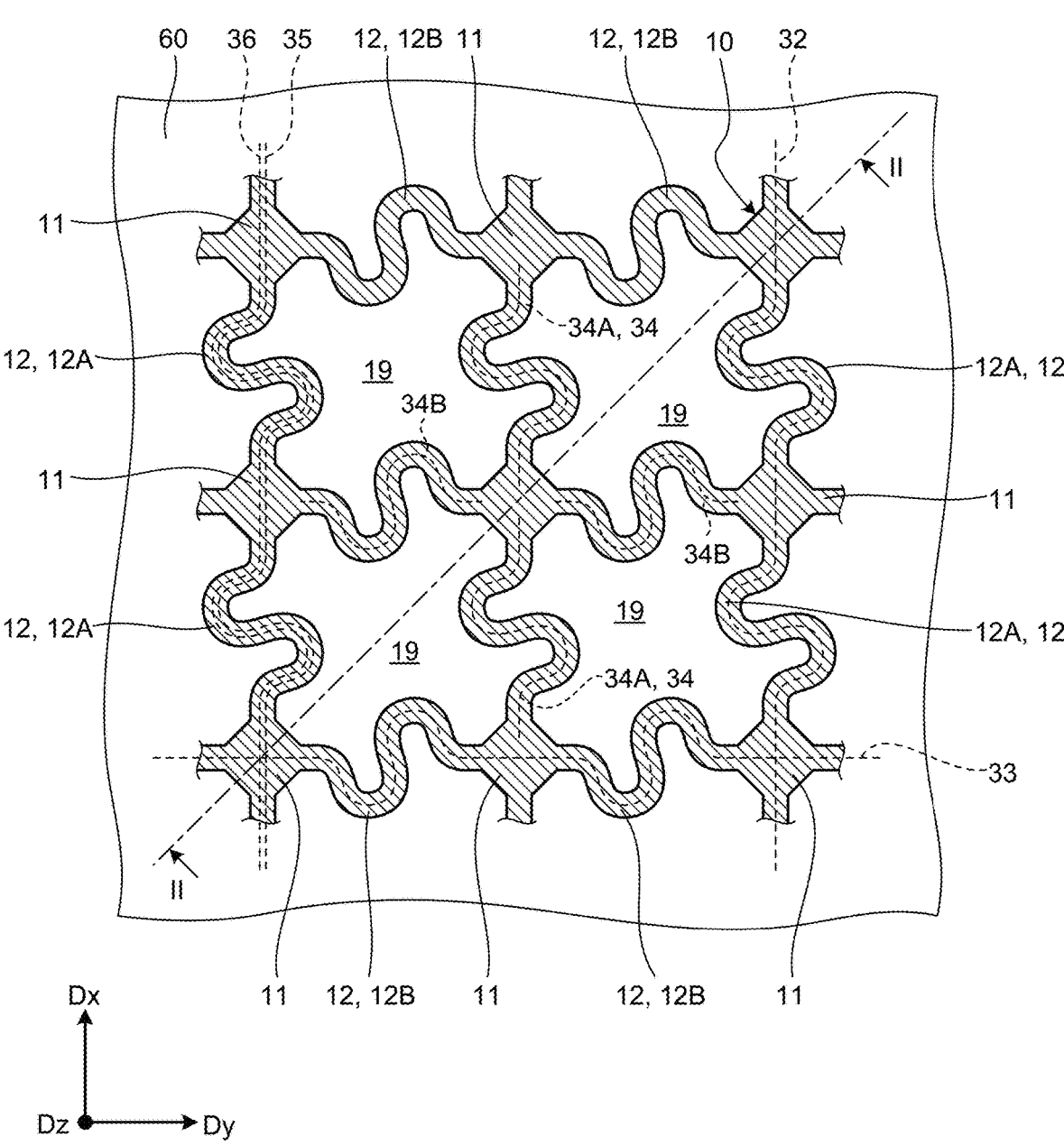
FIG. 3 is an enlarged view of part of a resin base member and a first resin plate of the stretchable device according to the first embodiment viewed from an array layer.

FIG. 2 is a schematic of a section of the stretchable device according to the first embodiment, and more specifically a sectional view along line II-II of FIG. 3. As illustrated in FIG. 2, the stretchable device 1 includes a first resin plate 60, a second resin plate 70, a resin base member 10, and an array layer 30. The first resin plate 60 has the back surface 1b. The second resin plate 70 has the surface 1a. The resin base member 10 and the array layer 30 are sandwiched between the first resin plate 60 and the second resin plate 70. The resin base member 10 and the array layer 30 are stacked in this order on the surface of the first resin plate 60 opposite to the back surface 1b.

The first resin plate 60 and the second resin plate 70 are made of resin material and have elasticity and flexibility. While examples of the resin material include, but are not limited to, acrylic resin, epoxy resin, urethane resin, etc., the present disclosure is not limited thereto. In the following description, the upper side or upward refers to one side in the third direction Dz and the side on which the second resin plate 70 is positioned when viewed from the first resin plate 60. The lower side or downward refers to the other side in the third direction Dz and the side on which the first resin plate 60 is positioned when viewed from the second resin plate 70.

FIG. 3 is an enlarged view of part of the resin base member and the first resin plate of the stretchable device according to the first embodiment viewed from the array layer. In FIG. 3, the resin base member 10 is hatched to make it easy to see the resin base member 10. The resin base member 10 is provided on the upper surface of the first resin plate 60. The resin base member 10 has elastic, flexible, and insulating properties. The resin base member 10 is made of resin material, such as polyimide.

The resin base member 10 includes bodies 11 and hinges 12. The bodies 11 are arrayed in a matrix (row-column configuration) in the first direction Dx and the second direction Dy. The hinges 12 couple the adjacent bodies 11.

The body 11 according to the present embodiment has a rectangular (square) shape in plan view. The four corners of the body 11 are disposed along the first direction Dx and the second direction Dy. The array layer 30 stacked on the body 11 includes a transistor 31 (refer to FIG. 5). The shape of the body 11 according to the present disclosure in plan view is not limited to a rectangular shape and may be circular or other polygonal shapes.

The hinges 12 include longitudinal hinges 12A and lateral hinges 12B. The longitudinal hinge 12A extends in the first direction Dx. The lateral hinge 12B extends in the second direction Dy. The array layer 30 stacked on the longitudinal hinge 12A includes a signal line 32, a strain gauge 34, a first output line 35, and a second output line 36. By contrast, the array layer 30 stacked on the lateral hinge 12B includes a gate line 33 and a strain gauge 34. The hinge 12 will be described later in greater detail.

The part between the bodies 11 and the hinges 12 serves as a hollow portion 19 passing through the resin base member 10 in the third direction Dz. Therefore, the resin base member 10 has a plurality of hollow portions 19.

The array layer 30 is not stacked on the regions overlapping the hollow portions 19. As illustrated in FIG. 2, the hollow portion 19 is filled with the second resin plate 70. With this configuration, the stretchable device 1 has low rigidity in the area overlapping the hollow portion 19 and has elasticity and bendability (stretchability). When a load acts on the stretchable device 1, the hinges 12 overlapping the hollow portions 19 in the first direction Dx or the second direction Dy are deformed. This mechanism reduces the amount of deformation in the bodies 11 and suppresses damage to functional elements (transistors 31 according to the present embodiment) stacked on the bodies 11. While the hollow portion 19 according to the present embodiment is filled with the second resin plate 70, it may be filled with the first resin plate 60 or the first resin plate 60 and the second resin plate 70.

The following describes the array layer 30. The array layer 30 includes various components for detecting the amount of strain of the hinge 12.

Figure 4:
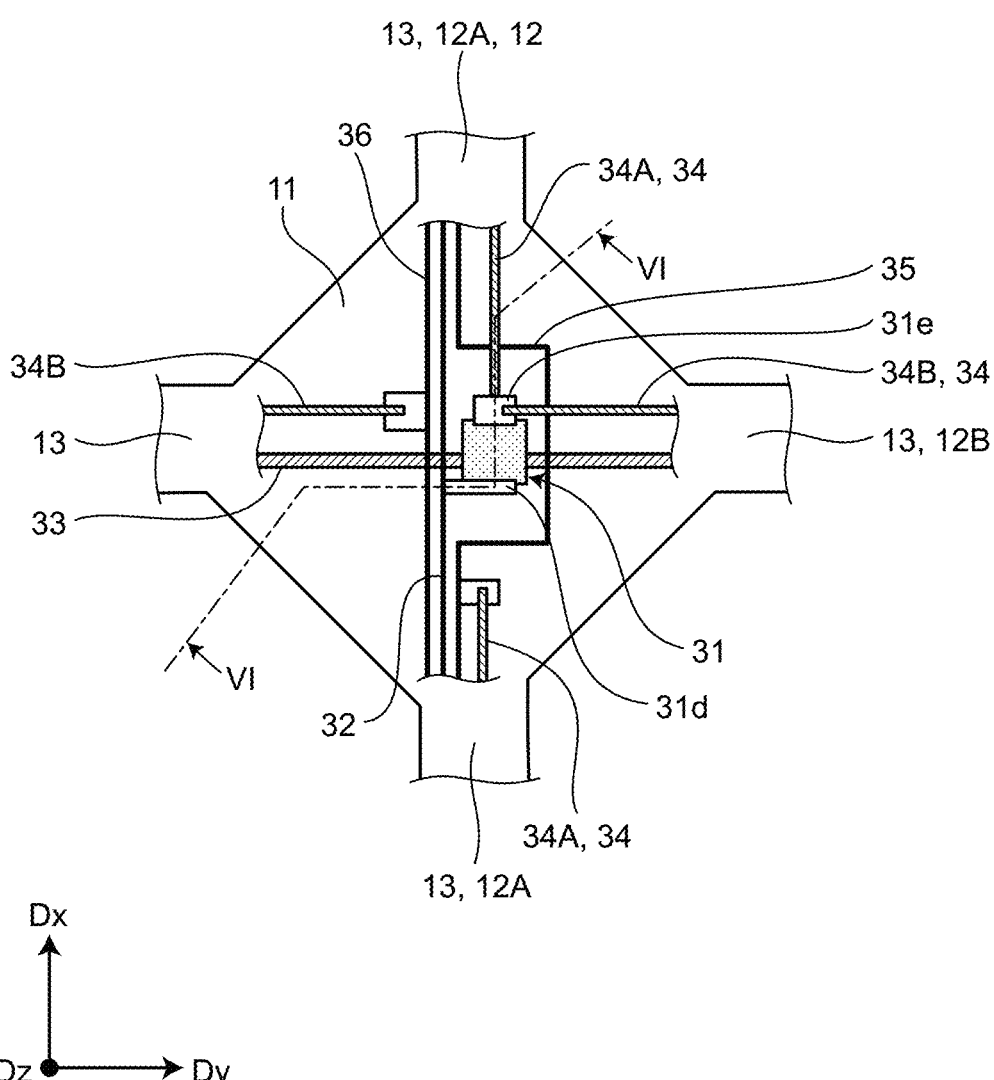
FIG. 4 is a plan view of a part of the array layer according to the first embodiment stacked on the body viewed from a second resin plate.

Specifically, the array layer 30 includes a coupler 6 (refer to FIG. 1), a gate line drive circuit 7 (refer to FIG. 1), an output line selection circuit 8 (refer to FIG. 1), current wiring 9 (refer to FIG. 1), a plurality of transistors 31 (refer to FIG. 4), a plurality of signal lines 32 extending in the first direction Dx (refer to FIG. 4), a plurality of gate lines 33 extending in the second direction Dy (refer to FIG. 4), a plurality of strain gauges 34 (refer to FIG. 4), a plurality of first output lines 35 extending in the first direction Dx (refer to FIG. 4), and a plurality of second output lines 36 extending in the first direction Dx (refer to FIG. 4).

As illustrated in FIG. 1, the coupler 6, the gate line drive circuit 7, the output line selection circuit 8, and the current wiring 9 are disposed overlapping the peripheral region 3. The coupler 6 is coupled to a drive integrated circuit (IC) disposed outside the stretchable device 1. The drive IC may be mounted as a chip on film (COF) on a flexible printed circuit board or a rigid board, which is not illustrated, and coupled to the coupler 6. Alternatively, the drive IC may be mounted as a chip on glass (COG) in the peripheral region 3 of the first resin plate 60.

The gate line drive circuit 7 is a circuit that drives the gate lines 33 based on various control signals supplied from the drive IC. The gate line drive circuit 7 sequentially or simultaneously selects the gate lines 33 and supplies gate drive signals to the selected gate line 33. The output line selection circuit 8 is a switch circuit that sequentially or simultaneously selects the first output lines 35 and the second output lines 36. The output line selection circuit 8 is a multiplexer, for example. The output line selection circuit 8 couples the selected first output line 35 or the selected second output line 36 to the drive IC based on selection signals supplied from the drive IC. The current wiring 9 is wiring for supplying a predetermined amount of electric current to the signal lines 32 and extends along the peripheral region 3. The current wiring 9 is coupled to the drive IC via the coupler 6, and a predetermined amount of electric current flows through it.

The transistors 31, the signal lines 32, the gate lines 33, the strain gauges 34, the first output lines 35, and the second output lines 36 are stacked on the resin base member 10 (refer to FIG. 3) and are disposed in the detection region 2 (refer to FIG. 1).

As illustrated in FIG. 3, the signal line 32 is disposed over a plurality of longitudinal hinges 12A and a plurality of bodies 11. As a result, the signal line 32 continuously extends from one end to the other of the detection region 2 in the first direction Dx. The signal lines 32 are arrayed in the second direction Dy. One end of each signal line 32 is coupled to the current wiring 9 (refer to FIG. 1).

The gate line 33 is disposed over the lateral hinges 12B and the bodies 11. As a result, the gate line 33 continuously extends from one end to the other of the detection region 2 in the second direction Dy. The gate lines 33 are arrayed in the first direction Dx. One end of each gate line 33 is coupled to the gate line drive circuit 7 (refer to FIG. 1).

The first output line 35 and the second output line 36 are wiring through which output signals (electric current) from the strain gauge 34 flow. The first output line 35 and the second output line 36 are disposed over the longitudinal hinges 12A and the bodies 11. As a result, the first output line 35 and the second output line 36 continuously extend from one end to the other of the detection region 2 in the first direction Dx. One end of each of the first output lines 35 and the second output lines 36 is coupled to the output line selection circuit 8.

FIG. 4 is a plan view of a part of the array layer according to the first embodiment stacked on the body viewed from the second resin plate. As illustrated in FIG. 4, the transistors 31 are stacked on the respective bodies 11 of the resin base member 10. Therefore, the transistors 31 are arrayed in a matrix (row-column configuration) in the detection region 2. The transistor 31 is disposed at the center of the body 11 in plan view. A gate electrode 31c (refer to FIG. 6) of the transistor 31 is coupled to the gate line 33 extending in the second direction Dy above the body 11. A drain electrode 31d of the transistor 31 is coupled to the signal line 32 extending in the first direction Dx above the body 11.

As illustrated in FIG. 3, the strain gauge 34 is wiring for measuring the amount of strain in the hinge 12. The strain gauges 34 are stacked on the respective hinges 12. Thus, the strain gauges 34 include longitudinal strain gauges 34A and lateral strain gauges 34B. The longitudinal strain gauge 34A is stacked on the longitudinal hinge 12A and extends in the first direction Dx. The lateral strain gauge 34B is stacked on the lateral hinge 12B and extends in the second direction Dy.

As illustrated in FIG. 4, one end of the longitudinal strain gauge 34A is disposed on one of the two bodies 11 that sandwich the longitudinal hinge 12A and is coupled to a source electrode 31e of the transistor 31. The other end of the longitudinal strain gauge 34A is disposed on the other of the two bodies 11 that sandwich the longitudinal hinge 12A and is coupled to the first output line 35.

As illustrated in FIG. 4, one end of the lateral strain gauge 34B is disposed on one of the two bodies 11 that sandwich the lateral hinge 12B and is coupled to the source electrode 31e of the transistor 31. The other end of the lateral strain gauge 34B is provided on the other of the two bodies 11 that sandwich the lateral hinge 12B and is coupled to the second output line 36.

Figure 5:
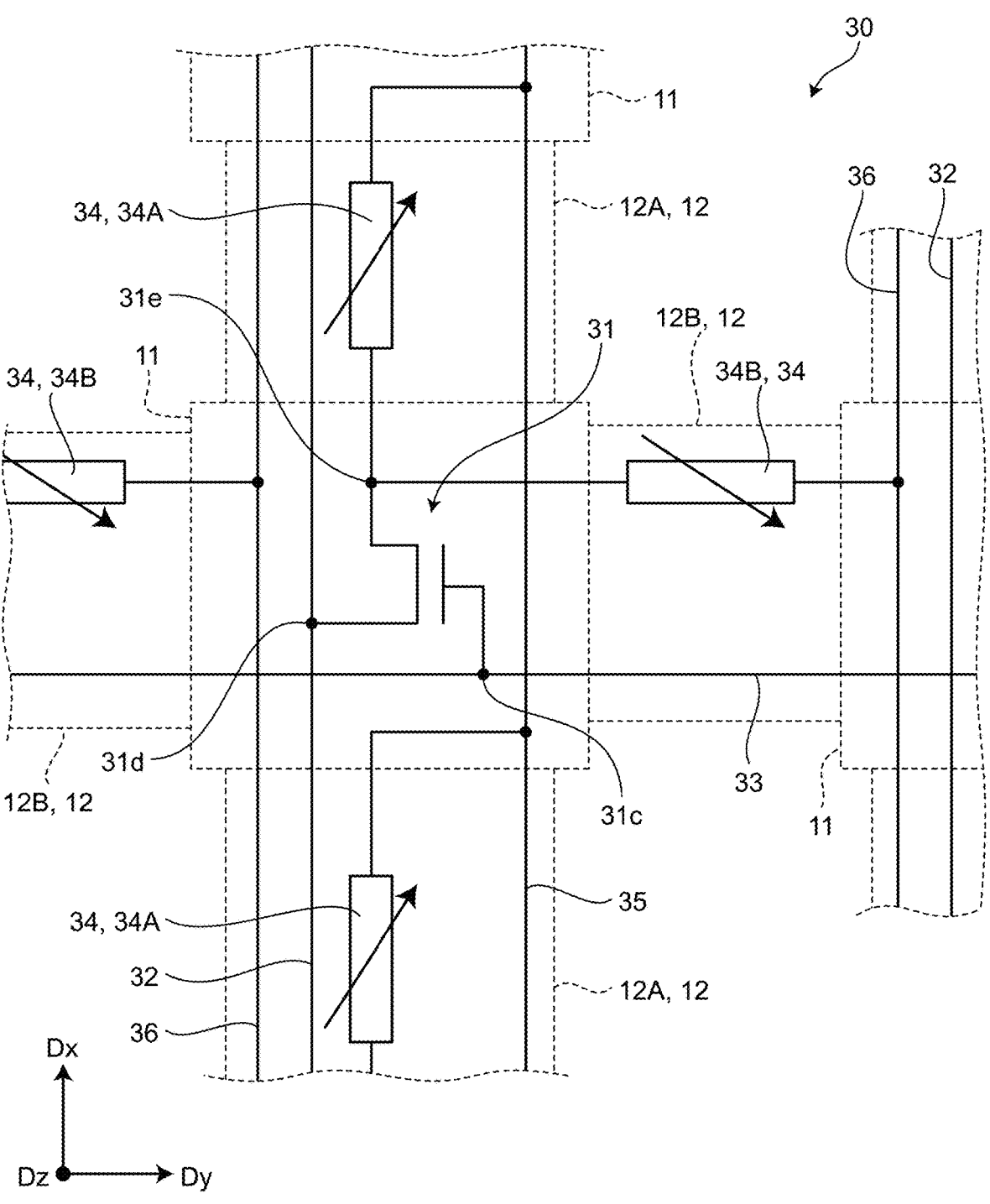
FIG. 5 is a diagram of the circuit configuration of the array layer stacked on a resin base member according to the first embodiment.

FIG. 5 is a diagram of the circuit configuration of the array layer stacked on the resin base member according to the first embodiment. In the circuit of the array layer described above, when the gate line 33 selected by the gate line drive circuit 7 is scanned, the transistor 31 is turned ON as illustrated in FIG. 5. As a result, the signal line 32 and one end of the strain gauge 34 are electrically coupled. Therefore, an electric current in the current wiring 9 flows to the strain gauges 34 (the longitudinal strain gauge 34A and the lateral strain gauge 34B). The electrical signal (electric current) from the longitudinal strain gauge 34A flows to the first output line 35. The electrical signal (electric current) from the lateral strain gauge 34B flows to the second output line 36. Subsequently, the first output line 35 or the second output line 36 selected by the output line selection circuit 8 is coupled to the drive IC. As a result, the electrical signal (electric current) from the first output line 35 or the second output line 36 is transmitted to the drive IC.

The following describes the sectional structure of the part of the array layer 30 stacked on the body 11.

Figure 6:
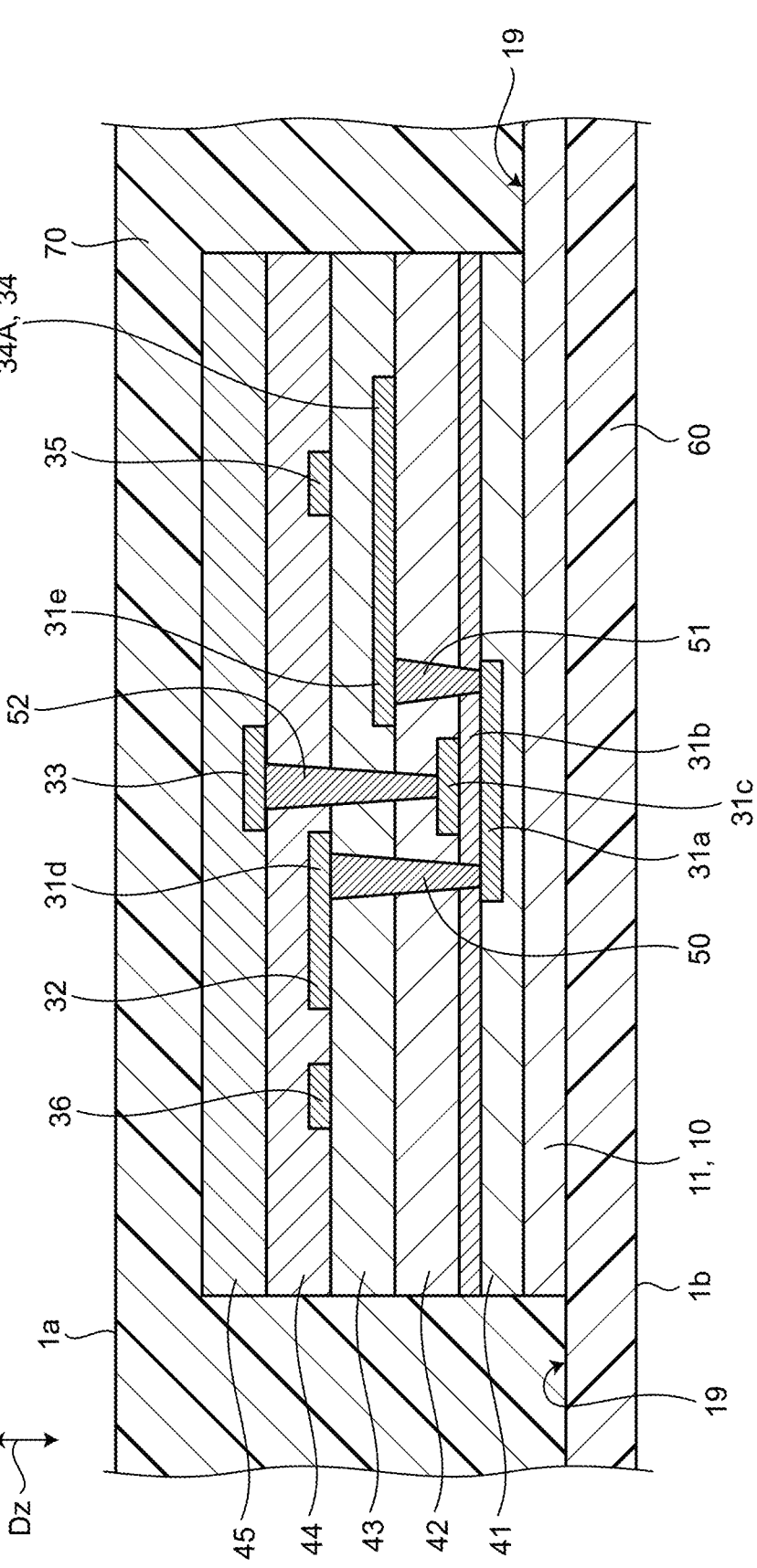
FIG. 6 is a sectional view seen in the arrow direction along line VI-VI of FIG. 4.

FIG. 6 is a sectional view seen in the arrow direction along line VI-VI of FIG. 4. As illustrated in FIG. 6, a plurality of insulating layers are stacked on the part of the array layer 30 stacked on the body 11. Specifically, a first insulating layer 41, a second insulating layer 42, a third insulating layer 43, a fourth insulating layer 44, and a fifth insulating layer 45 are stacked on the body 11. The first insulating layer 41, the second insulating layer 42, the third insulating layer 43, the fourth insulating layer 44, and the fifth insulating layer 45 are silicon oxide films, for example, and cover the transistor 31 and various kinds of wiring (the signal line 32, the gate line 33, the strain gauge 34, the first output line 35, and the second output line 36). In the configuration according to the present embodiment, a gate insulating film 31b of the transistor 31 is interposed between the first insulating layer 41 and the second insulating layer 42.

The strain gauge 34 is stacked on the second insulating layer 42. The signal line 32 is stacked on the third insulating layer 43. The gate line 33 is stacked on the fourth insulating layer 44. The transistor 31 includes a semiconductor layer 31a, the gate insulating film 31b, the gate electrode 31c, the drain electrode 31d, and the source electrode 31e. The semiconductor layer 31a is coupled to the drain electrode 31d and the source electrode 31e via contact layers 50 and 51. The gate electrode 31c is coupled to the gate line 33 via a contact layer 52. The drain electrode 31d is disposed in the same layer as that of the signal line 32 and is coupled to the signal line 32. The source electrode 31e is disposed in the same layer as that of the strain gauge 34 and is coupled to the strain gauge 34.

The following describes the part of the array layer 30 stacked on the hinge 12. Before that, the hinge 12 is described in greater detail. When the longitudinal hinge 12A is rotated by 90 degrees, it has the same shape as that of the lateral hinge 12B. Therefore, the longitudinal hinge 12A is described below as a representative example.

Figure 7:
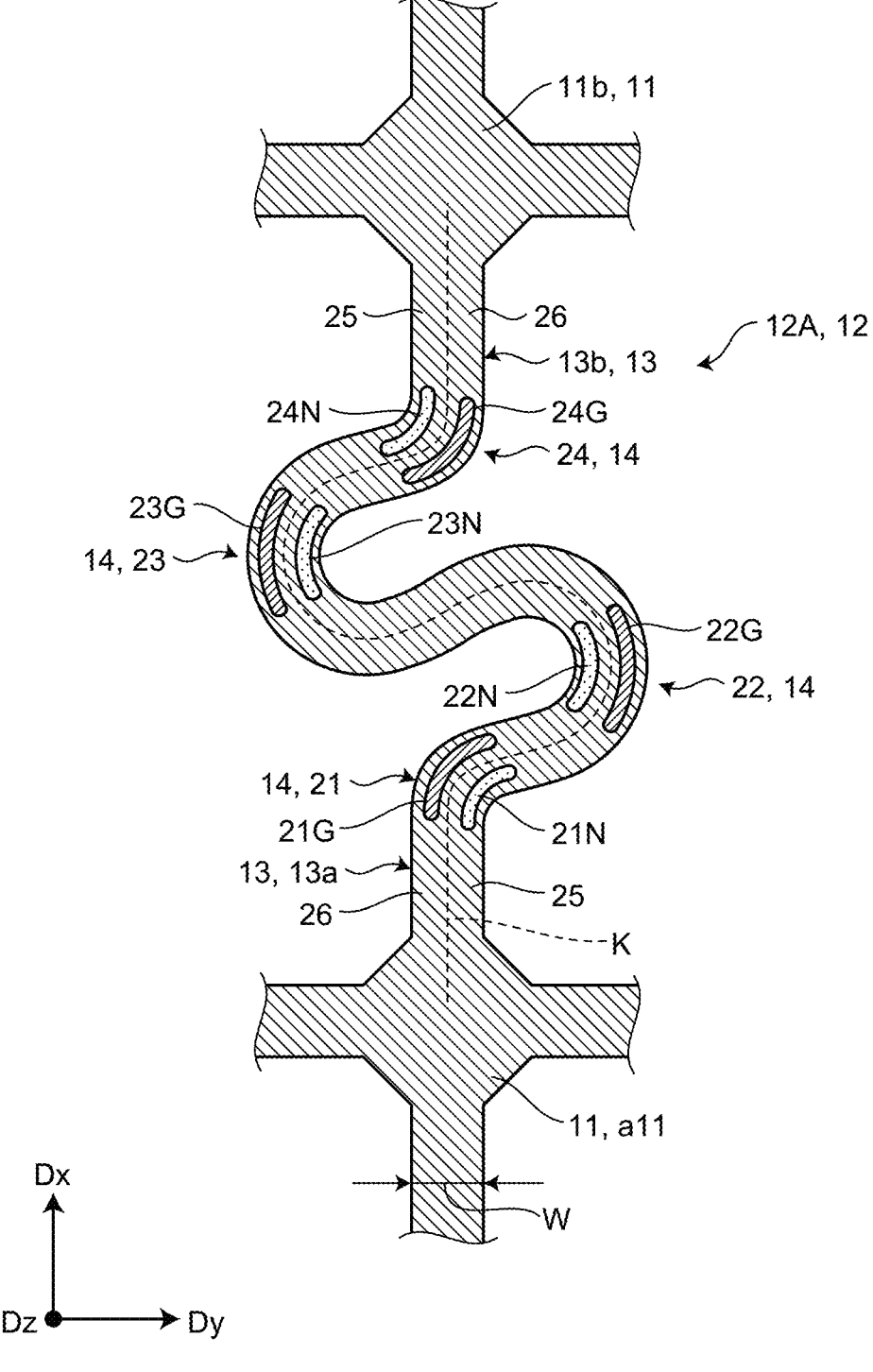
FIG. 7 is an enlarged view of a longitudinal hinge according to the first embodiment.
Figure 8:
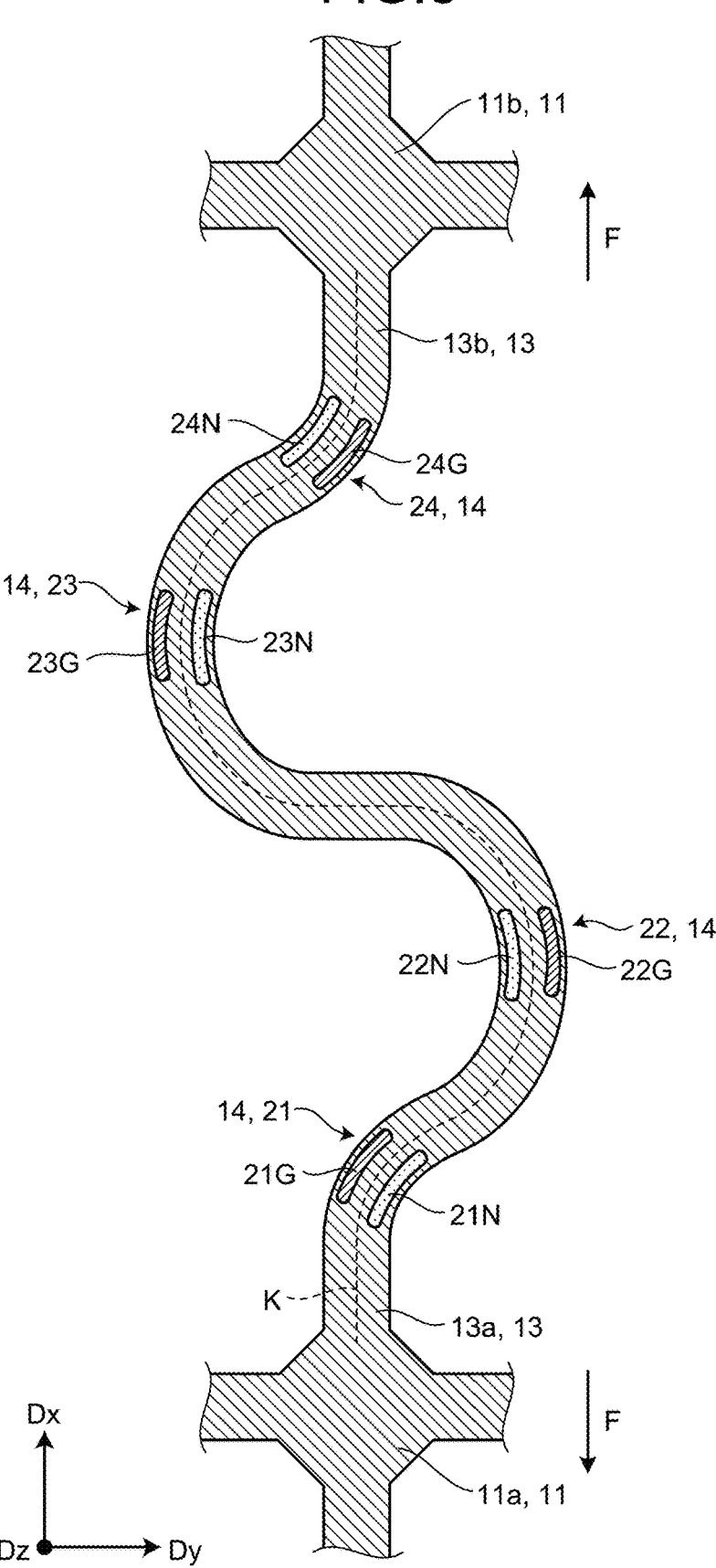
FIG. 8 is an enlarged view of the longitudinal hinge according to the first embodiment when a load that stretches the longitudinal hinge in a first direction is applied.

FIG. 7 is an enlarged view of the longitudinal hinge according to the first embodiment. FIG. 8 is an enlarged view of the longitudinal hinge according to the first embodiment when a load that stretches the longitudinal hinge in the first direction is applied. An imaginary line K illustrated in FIGS. 7 and 8 passes through the center of the longitudinal hinge 12A in the width direction.

As illustrated in FIG. 7, a length W of the longitudinal hinge 12A in the width direction is constant in the length direction in which the longitudinal hinge 12A extends. The longitudinal hinge 12A extends in the first direction Dx while meandering between two bodies 11. The longitudinal hinge 12A includes two bases 13 and four bends 14. The two bases 13 are disposed at both ends of the longitudinal hinge 12A in the length direction. The four bends 14 are disposed between the two bases 13. For the convenience of explanation, one of the two bodies 11 that sandwich the longitudinal hinge 12A is referred to as a first body 11a, and the other is referred to as a second body 11b.

The base 13 is continuous with the body 11 and linearly extends from the body 11 in the first direction Dx. One of the two bases 13 provided continuously with the first body 11a is referred to as a first base 13a, and the other provided continuously with the second body 11b is referred to as a second base 13b.

The bend 14 is bent in the second direction Dy. The bend 14 according to the present embodiment has an arc shape. The bend according to the present disclosure does not necessarily have an arc shape and may have an angular shape. The four bends 14 are a first arc 21, a second arc 22, a third arc 23, and a fourth arc 24 arranged in the order as listed, from the first base 13a to the second base 13b. The first arc 21 and the fourth arc 24 each form a quadrant and are bent at 90 degrees. The second arc 22 and the third arc 23 each form a semi-circular arc and are bent at 180 degrees.

One end of the first arc 21 is coupled to the first base 13a. The first arc 21 is bent to one side in the second direction Dy with respect to the first base 13a. One end of the fourth arc 24 is coupled to the second base 13b. The fourth arc 24 is bent from the second base 13b to the other side in the second direction Dy. Therefore, the first arc 21 and the fourth arc 24 are bent in opposite directions.

One end of the second arc 22 is coupled to the first arc 21. The other end of the second arc 22 faces the other side in the second direction Dy. One end of the third arc 23 is coupled to the fourth arc 24, and the other end thereof faces the one side in the second direction Dy and is coupled to the other end of the second arc 22. Thus, the longitudinal hinge 12A meanders by the four bends 14. The first arc 21 and the fourth arc 24 may be referred to as first bends. The second arc 22 and the third arc 23 may be referred to as second bends.

As illustrated in FIG. 7, each bend 14 is divided into two portions: an inner peripheral portion positioned on the inner side (inner peripheral side) and an outer peripheral portion positioned on the outer side (outer peripheral side) with respect to the imaginary line K serving as the boundary. In FIG. 7, the inner peripheral portion and the outer peripheral portion of each bend 14 are enclosed by ellipses to define the areas of the inner peripheral portion and the outer peripheral portion. However, the entire area on the inner peripheral side with respect to the imaginary line K is the inner peripheral portion, and the entire area on the outer peripheral side with respect to the imaginary line K is the outer peripheral portion. Therefore, the area enclosed by the ellipse is part of the inner peripheral portion or the outer peripheral portion.

When the stretchable device 1 is pulled in the first direction Dx (refer to arrow F in FIG. 8), for example, the longitudinal hinge 12A stretches in the first direction Dx as illustrated in FIG. 8. In other words, the bending angle of each bend 14 increases, and the length of the longitudinal hinge 12A in the first direction Dx increases. When the bending angle of each bend 14 increases, the following loads (stresses) act on the inner peripheral portion and the outer peripheral portion of each bend 14.

A tensile load acts on a first inner peripheral portion 21N of the first arc 21. A compressive load acts on a first outer peripheral portion 21G of the first arc 21. A tensile load acts on a second inner peripheral portion 22N of the second arc 22. A compressive load acts on a second outer peripheral portion 22G of the second arc 22. A tensile load acts on a third inner peripheral portion 23N of the third arc 23. A compressive load acts on a third outer peripheral portion 23G of the third arc 23. A tensile load acts on a fourth inner peripheral portion 24N of the fourth arc 24. A compressive load acts on a fourth outer peripheral portion 24G of the fourth arc 24.

In other words, a tensile load acts on the inner peripheral portion of each bend 14, and a compressive load acts on the outer peripheral portion of each bend 14. Therefore, if the longitudinal strain gauge 34A extends along the end of the longitudinal hinge 12A, both tensile and compressive loads act on it. As a result, the load acting on the longitudinal hinge 12A fails to be accurately detected. The amount of generated strain is smaller in the center of the longitudinal hinge 12A in the width direction (area overlapping the imaginary line K) than in the inner peripheral portion and the outer peripheral portion.

As illustrated in FIG. 7, the base 13 is divided into two portions: an inner peripheral coupling portion 25 positioned on one side in the second direction Dy and an outer peripheral coupling portion 26 positioned on the outer side in the second direction Dy with respect to the imaginary line K serving as the boundary. The inner peripheral coupling portion 25 is coupled to the first inner peripheral portion 21N or the fourth inner peripheral portion 24N. The outer peripheral coupling portion 26 is coupled to the first outer peripheral portion 21G or the fourth outer peripheral portion 24G. When the longitudinal hinge 12A is pulled in the first direction Dx, the amount of strain generated in the outer peripheral coupling portion 26 is smaller than that generated in the inner peripheral coupling portion 25.

Figure 9:
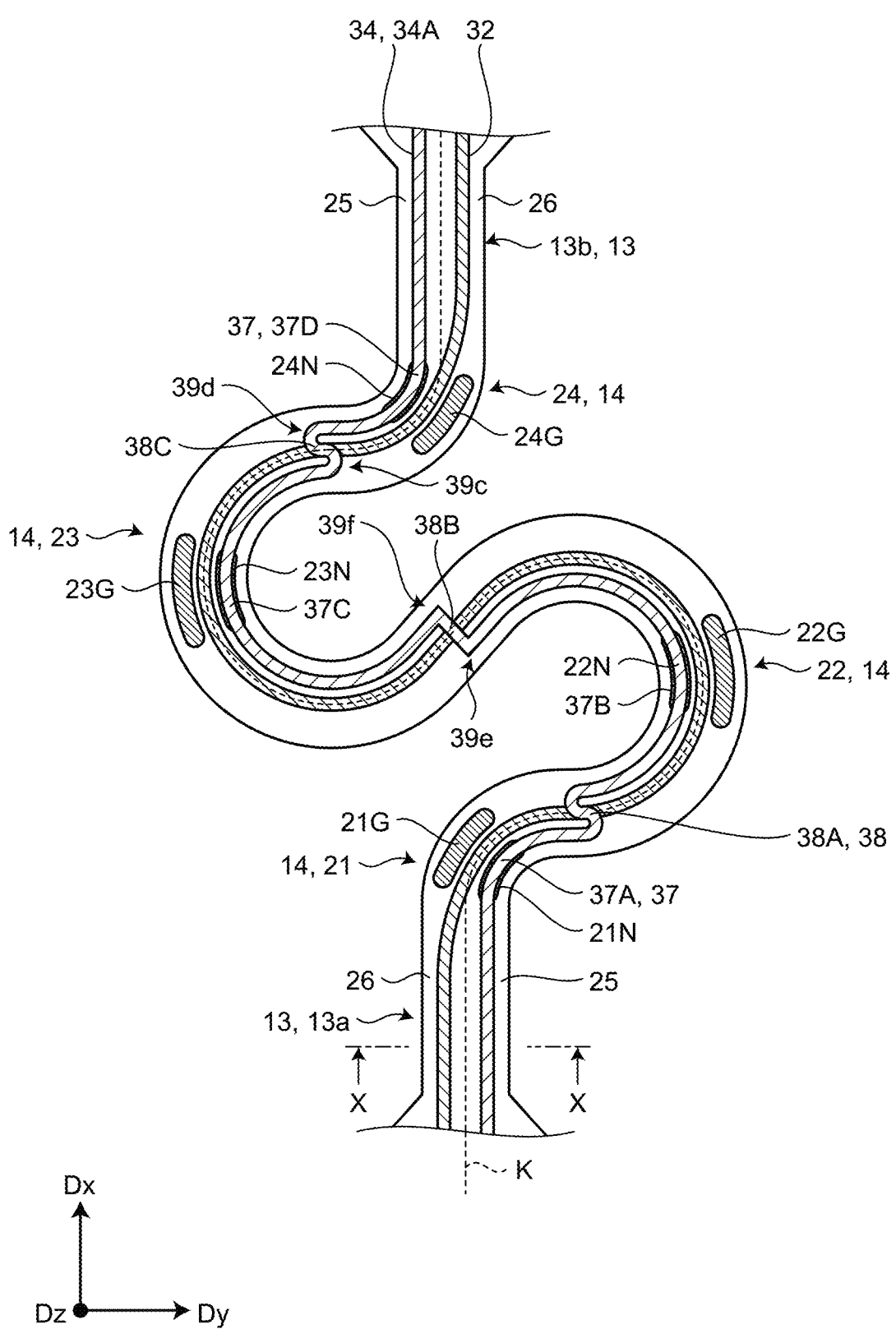
FIG. 9 is a plan view of a part of the array layer according to the first embodiment stacked on the longitudinal hinge viewed from the second resin plate.
Figure 10:
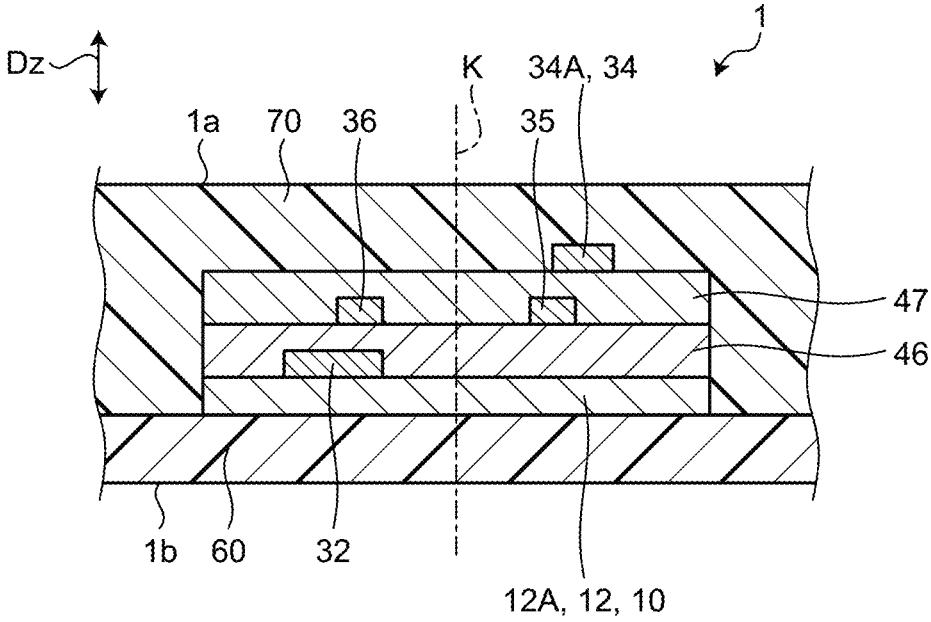
FIG. 10 is a sectional view seen in the arrow direction along line X-X of FIG. 9.
Figure 11:
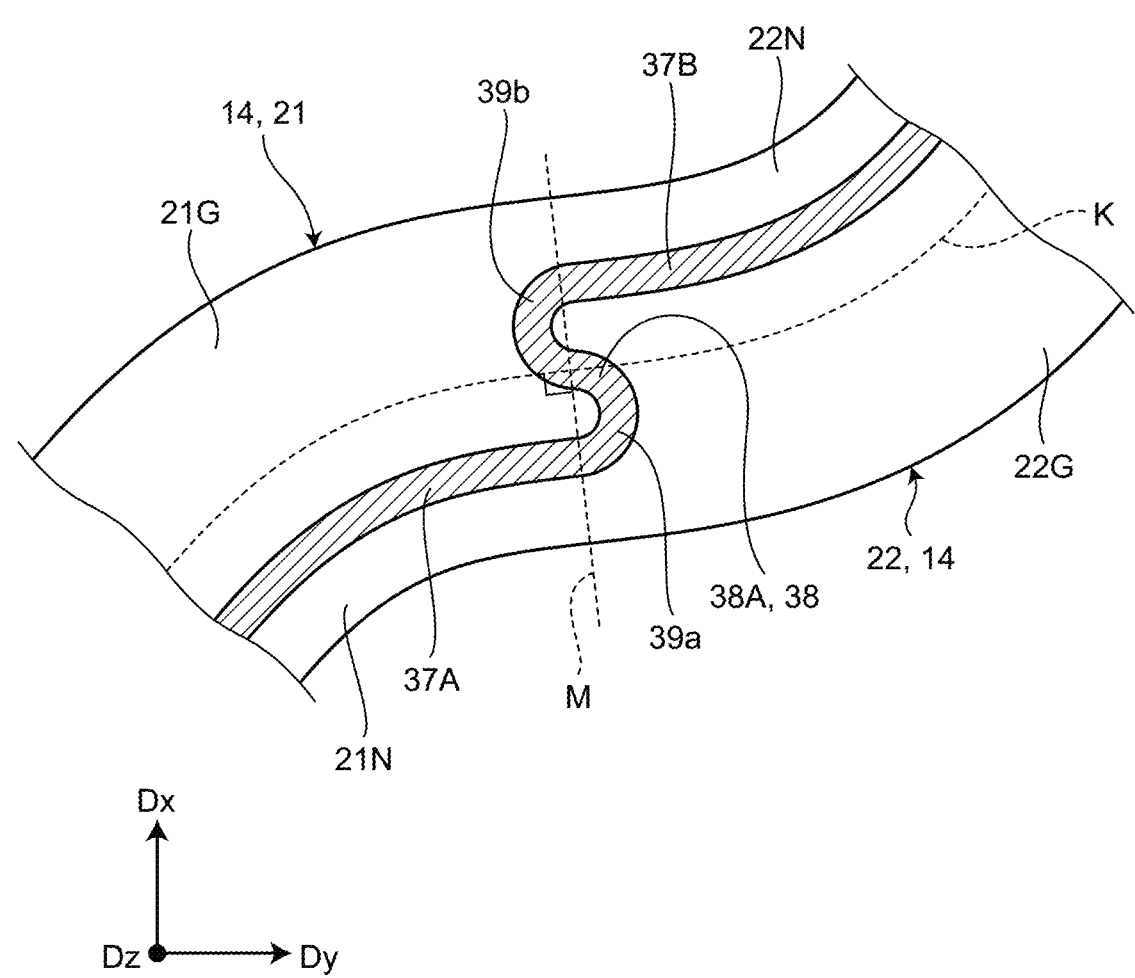
FIG. 11 is a plan view of an intersection of the strain gauge viewed from the second resin plate.

FIG. 9 is a plan view of a part of the array layer according to the first embodiment stacked on the longitudinal hinge viewed from the second resin plate. FIG. 10 is a sectional view seen in the arrow direction along line X-X of FIG. 9. FIG. 11 is a plan view of an intersection of the strain gauge viewed from the second resin plate. The following describes the part of the array layer 30 stacked on the longitudinal hinge 12A. The description of the part is made in the order of the sectional structure and the layout in plan view.

As illustrated in FIG. 10, the part of the array layer stacked on the longitudinal hinge 12A includes the signal line 32, the longitudinal strain gauge 34A, the first output line 35, and the second output line 36.

In the sectional structure of the part of the array layer 30 stacked on the longitudinal hinge 12A, the signal line 32 is stacked on the longitudinal hinge 12A. An insulating layer 46 is provided to cover the signal line 32 and the longitudinal hinge 12A. The first output line 35 and the second output line 36 are provided on the insulating layer 46. An insulating layer 47 is provided to cover the first output line 35, the second output line 36, and the insulating layer 46. The longitudinal strain gauge 34A is provided on the insulating layer 47. While the type of the insulating layers 46 and 47 is not limited, they are preferably made of polyimide or the like with high flexibility.

As illustrated in FIG. 9, the signal line 32 passes through the center of the longitudinal hinge 12A in the width direction in the area overlapping the four bends 14 in the layout in plan view. In other words, the signal line 32 overlaps the imaginary line K in plan view. With this configuration, the amount of strain generated in the signal line 32 is small if the four bends 14 are deformed when the longitudinal hinge 12A expands or contracts.

The signal line 32 overlaps the outer peripheral coupling portion 26 having a smaller amount of strain than the inner peripheral coupling portion 25 in the area overlapping the two bases 13. With this configuration, the amount of strain generated in the signal line 32 is small if the two bases 13 are deformed when the longitudinal hinge 12A expands or contracts.

The longitudinal strain gauge 34A includes a plurality of strain detectors 37 overlapping the bends 14 in plan view. The strain detectors 37 include a first strain detector 37A overlapping the first arc 21, a second strain detector 37B overlapping the second arc 22, a third strain detector 37C overlapping the third arc 23, and a fourth strain detector 37D overlapping the fourth arc 24.

The first strain detector 37A overlaps the first inner peripheral portion 21N in plan view. The second strain detector 37B overlaps the second inner peripheral portion 22N in plan view. The third strain detector 37C overlaps the third inner peripheral portion 23N in plan view. The fourth strain detector 37D overlaps the fourth inner peripheral portion 24N in plan view.

In other words, the longitudinal strain gauge 34A is disposed overlapping only the inner peripheral portion of each bend 14 and not overlapping the outer peripheral portion. This configuration reduces application of both tensile and compressive loads to the longitudinal strain gauge 34A when the longitudinal hinge 12A expands or contracts. As a result, the load (amount of strain) acting on the longitudinal hinge 12A can be accurately detected. The strain gauge according to the present disclosure may overlap only the outer peripheral portion of each bend 14.

The longitudinal strain gauge 34A includes a plurality of intersections 38 that extend in the width direction across the imaginary line K and couple the strain detectors 37. The intersections 38 include a first intersection 38A, a second intersection 38B, and a third intersection 38C. The first intersection 38A couples the first strain detector 37A to the second strain detector 37B. The second intersection 38B couples the second strain detector 37B to the third strain detector 37C. The third intersection 38C couples the third strain detector 37C to the fourth strain detector 37D.

As illustrated in FIG. 11, the longitudinal strain gauge 34A has a corner 39a where the first intersection 38A and the first strain detector 37A meet and a corner 39b where the first intersection 38A and the second strain detector 37B meet. The corners 39a and 39b are strained when the first strain detector 37A and the second strain detector 37B are deformed. The corners 39a and 39b are not the portions for detecting the amount of strain in the bend 14 when the longitudinal hinge 12A expands or contracts. For this reason, the amount of strain generated in the corners 39a and 39b is preferably small. The corners 39a and 39b according to the present embodiment have a tapered shape (arc shape). With this configuration, the amount of generated strain is smaller than in a case where the corners 39a and 39b have a right-angled shape.

The first intersection 38A is inclined with respect to an imaginary intersection line M orthogonal to the imaginary line K. Therefore, the amount of strain generated in the corners 39a and 39b is smaller than in a case where the first intersection 38A extends along the imaginary intersection line M (refer to an intersection 138A according to a second embodiment in FIG. 12). As described above, the longitudinal strain gauge 34A has a smaller amount of strain that causes noise components in the corners 39a and 39b and can accurately detect the amount of strain in the hinge 12.

As illustrated in FIG. 9, a corner 39c between the third intersection 38C and the third strain detector 37C and a corner 39d between the third intersection 38C and the fourth strain detector 37D also have a tapered shape (arc shape). Therefore, the amount of strain in the corners 39c and 39d is also small. A corner 39e between the second intersection 38B and the second strain detector 37B and a corner 39f between the second intersection 38B and the third strain detector 37C are right-angled. This is because the coupling portion between the second arc 22 and the third arc 23 where the second intersection 38B is provided is less likely to be strained when the longitudinal hinge 12A expands or contracts. In other words, the corners 39e and 39f are right-angled because they need not be tapered to reduce the amount of strain. The corners 39e and 39f according to the present disclosure may have a tapered shape.

As described above, the stretchable device 1 according to the first embodiment has a smaller amount of strain generated in the signal line 32 and the strain gauge 34 and accurately detects the amount of strain in the hinge 12.

Next, other embodiments obtained by modifying part of the first embodiment are described. The following describes the other embodiments focusing on the differences from the first embodiment.

Second Embodiment

Figure 12:
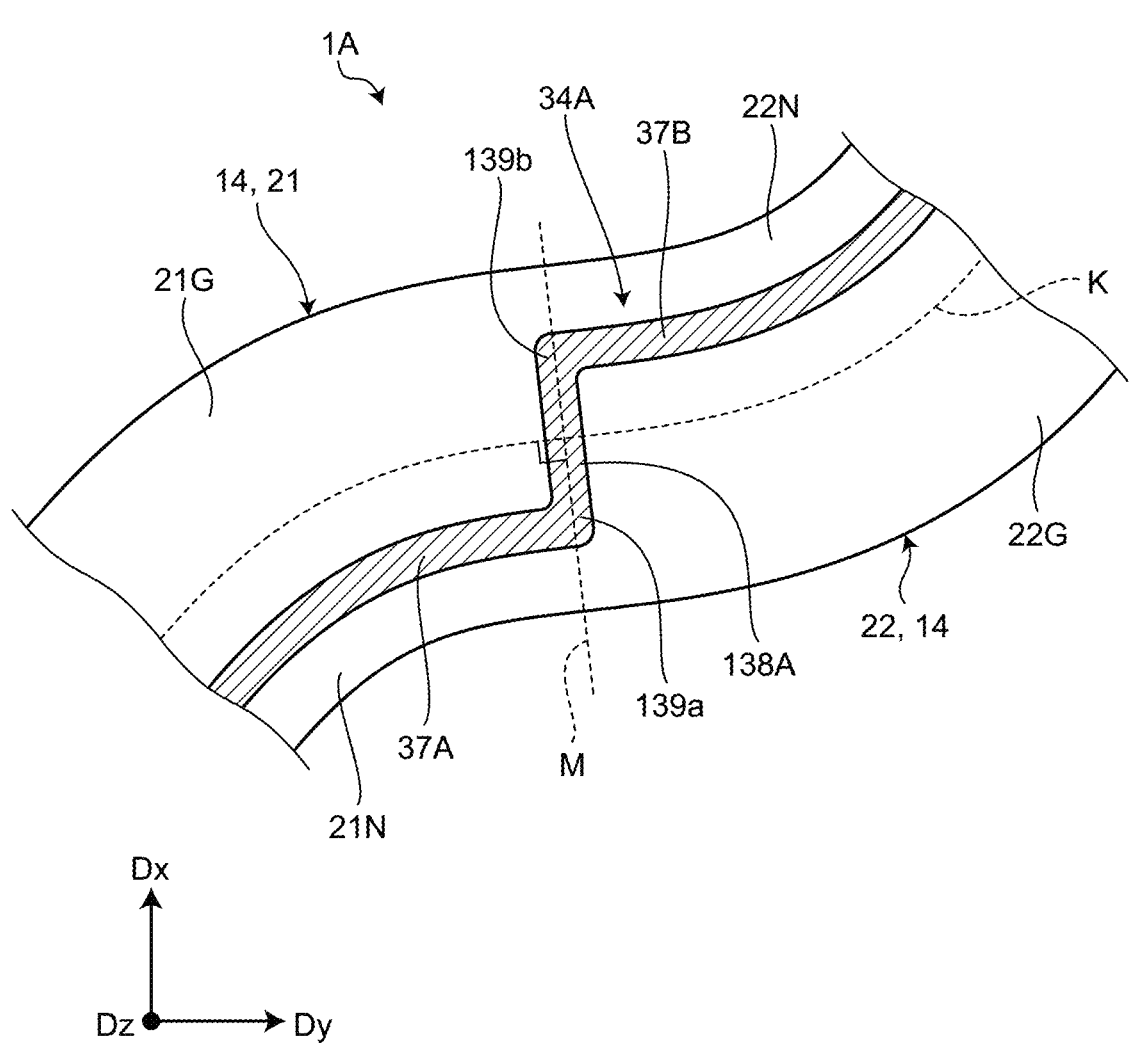
FIG. 12 is a plan view of the intersection of the strain gauge according to a second embodiment viewed from the second resin plate.

FIG. 12 is a plan view of the intersection of the strain gauge according to a second embodiment viewed from the second resin plate. A stretchable device 1A according to the second embodiment is different from the first embodiment in that an intersection 138A of the longitudinal strain gauge 34A extends along the imaginary intersection line M orthogonal to the imaginary line K. The intersection 138A with the structure described above also reduces the amount of strain generated in corners 139a and 139b. The first intersection 38A according to the first embodiment, however, can make the amount of strain generated in the corners 139a and 139b smaller.

Third Embodiment

Figure 13:
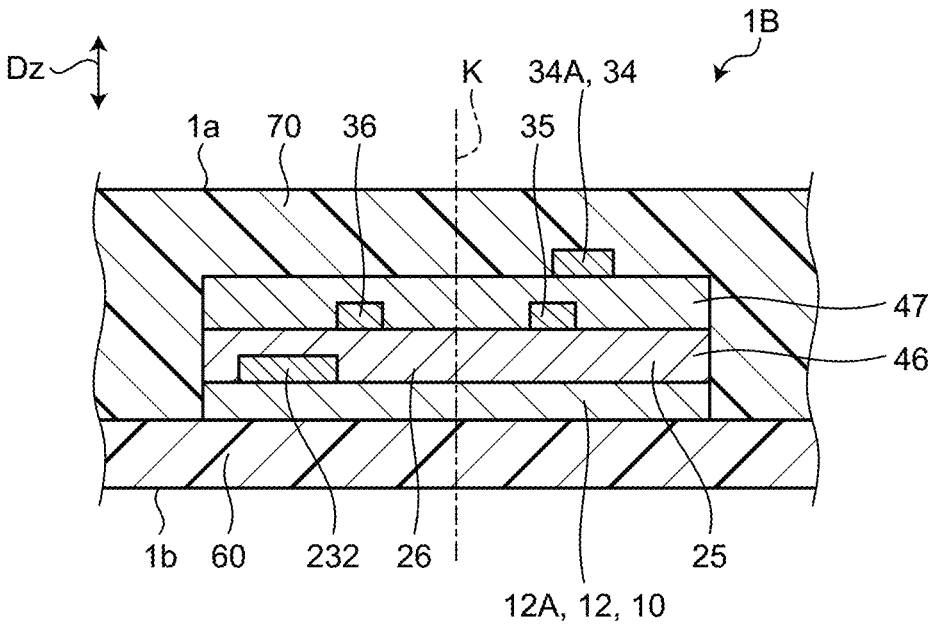
FIG. 13 is a sectional view of a base of the longitudinal hinge according to a third embodiment.

FIG. 13 is a sectional view of the base of the longitudinal hinge according to a third embodiment. A stretchable device 1B according to the third embodiment is different from the first embodiment in that a signal line 232 is disposed closer to the end of the outer peripheral coupling portion 26. With this configuration, the distance of the signal line 232 from the inner peripheral coupling portion 25 increases, and the amount of strain generated in the signal line 232 is reduced.

Figure 14:
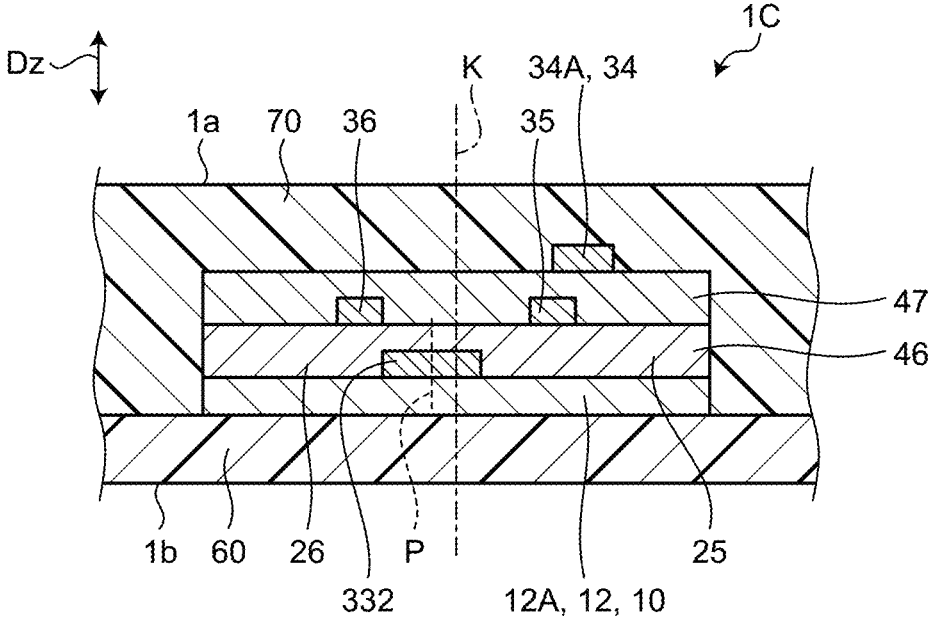
FIG. 14 is a sectional view of the base of the longitudinal hinge according to a modification.

FIG. 14 is a sectional view of the base of the longitudinal hinge according to a modification. To reduce the strain generated in the signal line, the entire signal line 32 according to the first embodiment and the entire signal line 232 according to the third embodiment are disposed in the outer peripheral coupling portion 26. In the present disclosure, however, an imaginary center line P of a signal line 332 in the width direction may overlap the outer peripheral coupling portion 26 as in a stretchable device 1C illustrated in FIG. 14. Also in this example, the signal line 332 has a smaller area overlapping the inner peripheral coupling portion 25, and the amount of strain is reduced.

Fourth Embodiment

Figure 15:
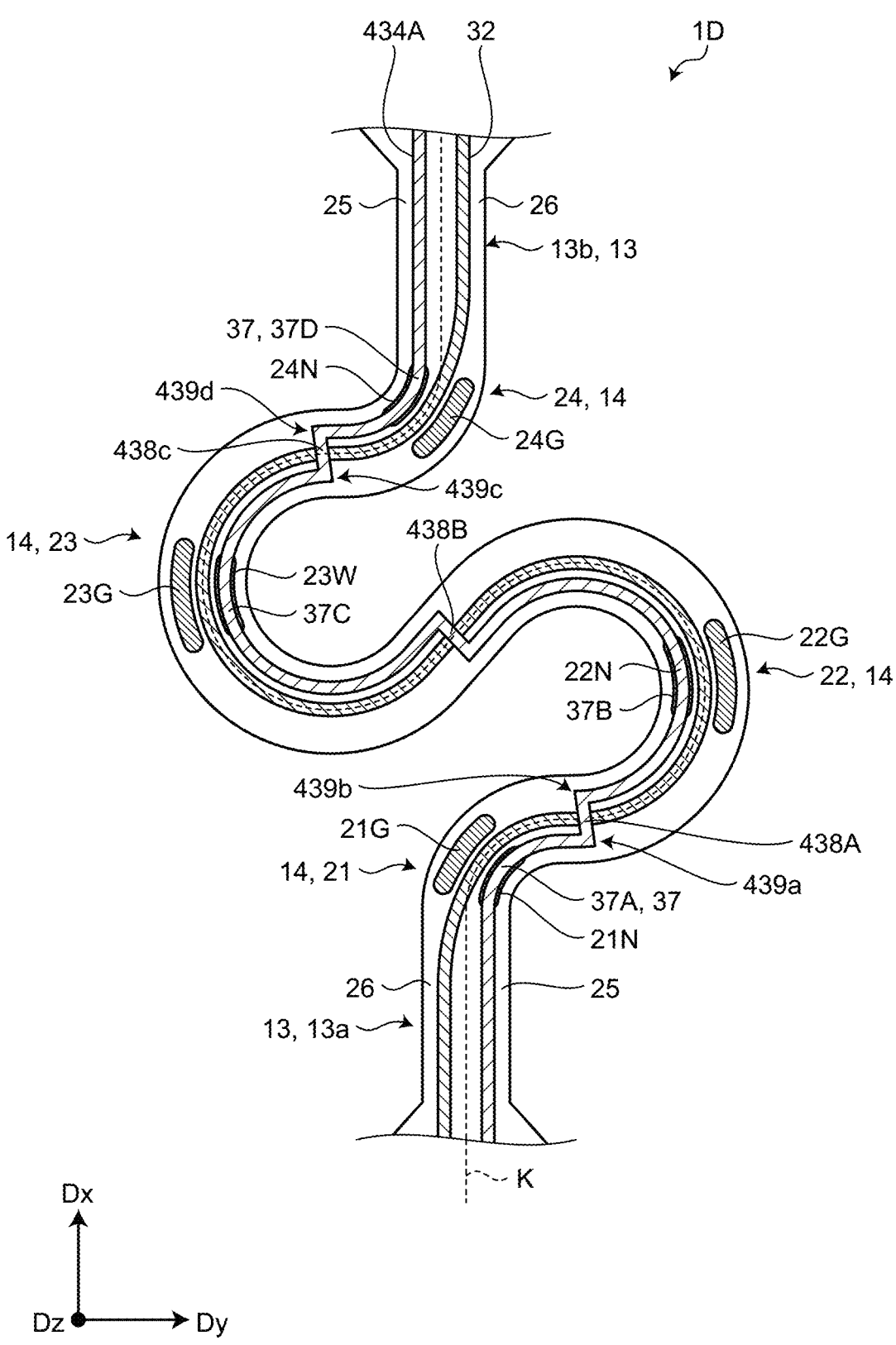
FIG. 15 is a plan view of the part of the array layer according to a fourth embodiment stacked on the longitudinal hinge viewed from the second resin plate.

FIG. 15 is a plan view of the part of the array layer according to a fourth embodiment stacked on the longitudinal hinge viewed from the second resin plate. A stretchable device 1D according to the fourth embodiment is different from the first embodiment in that corners 439a, 439b, 439c, and 439d are not tapered but right-angled. A first intersection 438A and a third intersection 439C are different from the first embodiment in that they extend along the imaginary intersection line M. With this configuration, the amount of strain generated in a longitudinal strain gauge 434A is not reduced. The amount of strain in the signal line 32, however, is small because the signal line 32 overlaps the outer peripheral coupling portion 26. Therefore, the amount of strain in the hinge 12 can be accurately detected.

Fifth Embodiment

Figure 16:
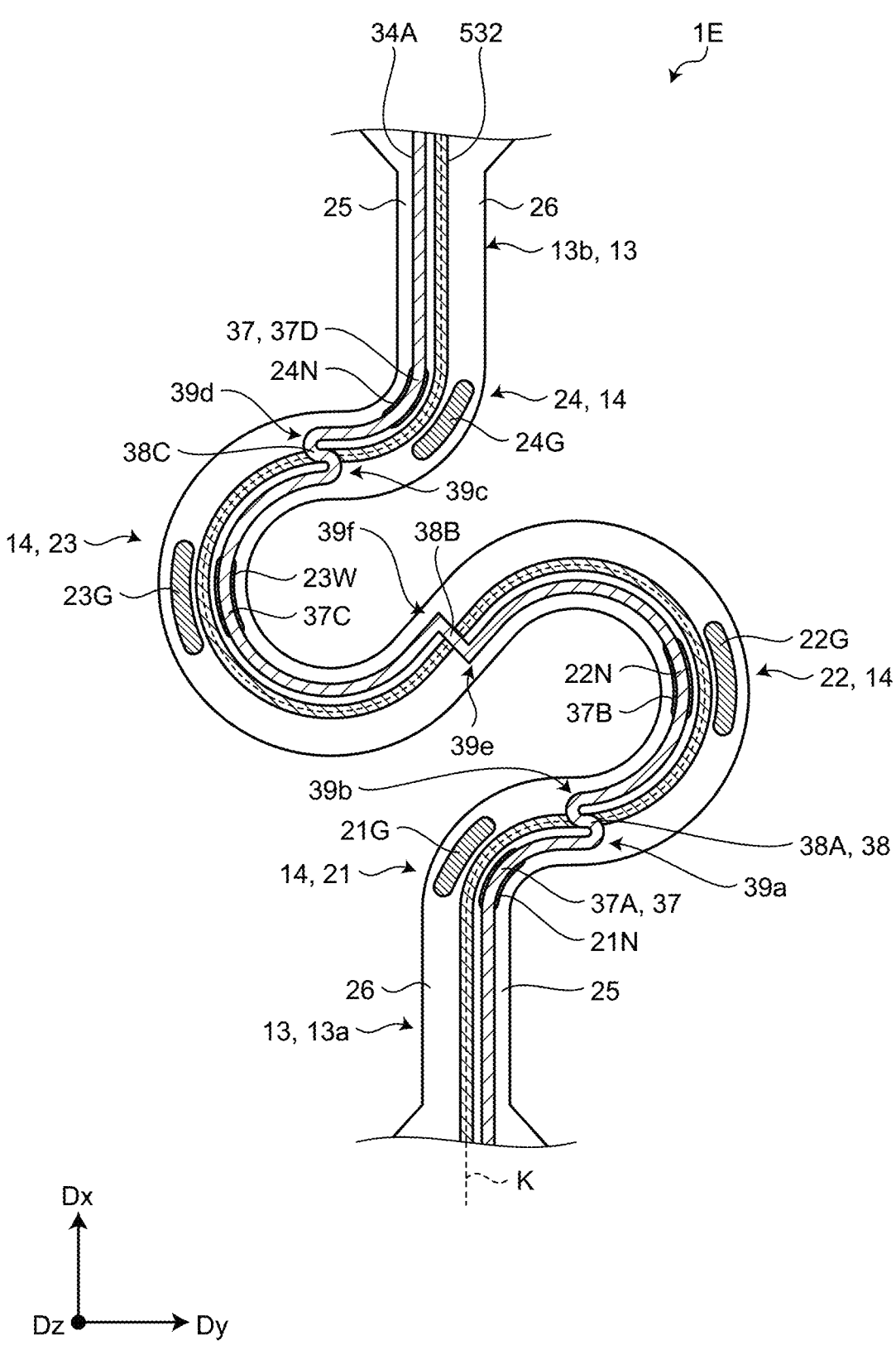
FIG. 16 is a plan view of the part of the array layer according to a fifth embodiment stacked on the longitudinal hinge viewed from the second resin plate.

FIG. 16 is a plan view of the part of the array layer according to a fifth embodiment stacked on the longitudinal hinge viewed from the second resin plate. A stretchable device 1E according to the fifth embodiment is different from the first embodiment in that the center line of a signal line 532 overlaps the imaginary line K in the base 13. With this configuration, the amount of strain in the signal line 532 is not reduced. The amount of strain in the corners 39a, 39b, 39c, and 39d in the longitudinal strain gauge 34A, however, is reduced. Therefore, the amount of strain in the hinge 12 can be accurately detected.

EXAMPLES

The following describes examples. The stretchable device according to the first embodiment was manufactured as an example. A stretchable device with the right-angled corners and the intersections extending along the imaginary intersection line M (refer to FIG. 11) was manufactured as a comparative example. In the example and the comparative example, the length W of the hinge 12 in the width direction was 90 μm, the length W of the signal line 32 in the width direction was 30 μm, and the length W of the strain gauge 34 in the width direction was 10 μm. The signal line 32 in the example was disposed such that the imaginary center line P (refer to FIG. 14) overlapped the center of the outer peripheral coupling portion 26 in the width direction. By contrast, the signal line 32 in the comparative example was disposed such that the imaginary center line P (refer to FIG. 14) overlapped the imaginary line K. The signal line 32 and the strain gauge 34 were made of aluminum (Al).

The amount of strain generated in the signal line 32 and the strain gauge 34 was measured in the example and the comparative example. The amount of generated strain is the amount of strain (%) compared with that before deformation. The amount of strain was measured in the entire signal line 32 and the entire strain gauge 34 in the length direction. The average value of the amount of strain (%) generated in each of the signal line 32 and the strain gauge 34 is indicated in Table 1. The amount of strain (maximum value (%)) in the part having the largest amount of strain in the length direction in each of the signal line 32 and the strain gauge 34 is also indicated in Table 1.

TABLE 1

| | Amount of strain | | | |
| --- | --- | --- | --- | --- |
| | Signal line | | Strain gauge | |
| | Average value (%) | Maximum value (%) | Average value (%) | Maximum value (%) |
| Comparative example | 1.89 | 4.56 | 4.42 | 11.8 |
| Example | 1.57 | 3.63 | 4.01 | 11.7 |

The maximum value of the amount of strain in the signal line 32 in the example was 3.63%. By contrast, the maximum value of the amount of strain in the signal line in the comparative example was 4.56%. In the example and the comparative example, the part where the maximum amount of strain was generated was the part overlapping the base 13. Therefore, it was found out that the amount of strain in the part of the signal line 32 overlapping the base 13 was reduced in the example. The average value (1.57%) of the amount of strain in the signal line 32 in the example was smaller than the average value (1.89%) in the comparison example because the amount of strain in the part of the signal line 32 overlapping the base 13 was reduced.

The maximum value of the amount of strain in the strain gauge 34 in the example was 11.7%. The maximum value of the amount of strain in the signal line in the comparative example was 11.8%. In each of the example and the comparative example, the part where the maximum amount of strain was generated was the strain detector 37, and the values were similar in both of them. By contrast, the average value of the amount of strain in the strain gauge 34 in the example was 4.01%, which was smaller than an average value of 4.42% in the comparison example. This is because the amount of strain generated in the corners of the strain gauge in the example was smaller than that in the comparative example. Therefore, it was found out that the amount of strain generated in the corners of the strain gauge was reduced in the example.

What is claimed is:

1. A stretchable device comprising:
a resin base member; and
a signal line and a strain gauge stacked on the resin base member, wherein
the resin base member comprises:
    a plurality of bodies disposed separately from each other; and
    a plurality of hinges that couple the bodies while meandering,
the hinges each comprise:
    a base linearly extending from the body; and
    a plurality of bends,
the bends include a first bend coupled to the base,
the first bend comprises a first inner peripheral portion positioned on an inner peripheral side and a first outer peripheral portion positioned on an outer peripheral side with respect to a center in a width direction serving as a boundary, the width direction being orthogonal to a length direction in which the hinge extends,
the base comprises an inner peripheral coupling portion coupled to the first inner peripheral portion and an outer peripheral coupling portion coupled to the first outer peripheral portion with respect to the center in the width direction serving as a boundary,
the signal line is provided to the hinge, and
an imaginary center line passing through the center of the signal line in the width direction overlaps the outer peripheral coupling portion when viewed in a stacking direction in which the signal line is stacked on the resin base member.

2. The stretchable device according to claim 1, wherein the bends include a second bend coupled to the first bend, the second bend comprises a second inner peripheral portion positioned on the inner peripheral side and a second outer peripheral portion positioned on the outer peripheral side with respect to the center in the width direction serving as a boundary, the second inner peripheral portion is coupled to the first outer peripheral portion,
the second outer peripheral portion is coupled to the first inner peripheral portion,
the strain gauge is provided to the hinge,
the strain gauge comprises:
two strain detectors overlapping the first inner peripheral portion and the second inner peripheral portion or the first outer peripheral portion and the second outer peripheral portion when viewed in the stacking direction; and
an intersection that extends in the width direction and couples the two strain detectors, and
a corner between the strain detector and the intersection has a tapered shape.

3. The stretchable device according to claim 1, wherein each of the hinges is S-shaped.

4. The stretchable device according to claim 1, wherein the signal line crosses the strain gauge in areas of each of the hinges, the areas being between the bends adjacent to each other.

5. A stretchable device comprising:
a resin base member; and
a signal line and a strain gauge stacked on the resin base member, wherein
the resin base member comprises:
a plurality of bodies disposed separately from each other; and
a plurality of hinges that couple the bodies while meandering,
the hinges each comprise:
a base linearly extending from the body; and
a plurality of bends,
the bends include:
a first bend coupled to the base; and
a second bend coupled to the first bend,
the first bend comprises a first inner peripheral portion positioned on an inner peripheral side and a first outer peripheral portion positioned on an outer peripheral side with respect to a center in a width direction serving as a boundary, the width direction being orthogonal to a length direction in which the hinge extends,
the second bend comprises a second inner peripheral portion positioned on the inner peripheral side and a second outer peripheral portion positioned on the outer peripheral side with respect to the center in the width direction serving as a boundary,
the second inner peripheral portion is coupled to the first outer peripheral portion,
the second outer peripheral portion is coupled to the first inner peripheral portion,
the strain gauge is provided to the hinge,
the strain gauge comprises:
strain detectors overlapping the first inner peripheral portion and the second inner peripheral portion or the first outer peripheral portion and the second outer peripheral portion when viewed in a stacking direction in which the signal line is stacked on the resin base member; and
an intersection that extends in the width direction at a boundary between the first bend and the second bend and couples the strain detectors, and
a corner between the strain detector and the intersection has a tapered shape.

\* \* \* \* \*